US011735272B2

United States Patent
Pekny

(10) Patent No.: US 11,735,272 B2
(45) Date of Patent: *Aug. 22, 2023

(54) NOISE REDUCTION DURING PARALLEL PLANE ACCESS IN A MULTI-PLANE MEMORY DEVICE

(71) Applicant: Micron Technology, Inc., Boise, ID (US)

(72) Inventor: Theodore Pekny, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/572,057

(22) Filed: Jan. 10, 2022

(65) Prior Publication Data
US 2022/0199169 A1    Jun. 23, 2022

Related U.S. Application Data

(63) Continuation of application No. 16/946,867, filed on Jul. 9, 2020, now Pat. No. 11,222,702.

(51) Int. Cl.
*G11C 16/26* (2006.01)
*G06F 12/0802* (2016.01)
*G11C 16/04* (2006.01)

(52) U.S. Cl.
CPC .......... *G11C 16/26* (2013.01); *G06F 12/0802* (2013.01); *G11C 16/04* (2013.01)

(58) Field of Classification Search
CPC .......... G11C 16/26; G11C 16/04; G11C 7/02; G11C 5/143; G11C 7/22; G11C 8/18;
(Continued)

(56) References Cited

U.S. PATENT DOCUMENTS

2009/0196102 A1  8/2009  Kim
2014/0062945 A1  3/2014  Monson
(Continued)

FOREIGN PATENT DOCUMENTS

EP        2450798 A1    5/2012

OTHER PUBLICATIONS

International Search Report and Written Opinion for International Application No. PCT/US2021/041168, dated Oct. 18, 2021, 13 pages.

*Primary Examiner* — Fernando Hidalgo
(74) *Attorney, Agent, or Firm* — Lowenstein Sandler LLP

(57) ABSTRACT

A memory device includes a memory array comprising a plurality of planes and a plurality of independent plane driver circuits. The memory device further includes control logic to detect an occurrence of a high noise event associated with a first independent plane driver circuit of the plurality of independent plane driver circuits. The control logic is further to determine whether a quiet event associated with a second independent plane driver circuit of the plurality of independent plane driver circuits is concurrently occurring. Responsive to determining that the quiet event associated with the second independent plane driver circuit is concurrently occurring, the control logic is to manage execution of the high noise event and the quiet event based on respective priorities of the first and second independent plane driver circuits.

17 Claims, 6 Drawing Sheets

(58) Field of Classification Search
CPC ... G11C 16/08; G11C 16/225; G11C 16/3427; G11C 8/12; G06F 12/0802
USPC .................................................. 365/185.12
See application file for complete search history.

(56) References Cited

U.S. PATENT DOCUMENTS

| | | |
|---|---|---|
| 2014/0071758 A1 | 3/2014 | Maejima |
| 2019/0205244 A1 | 7/2019 | Smith |
| 2019/0371380 A1 | 12/2019 | Vancha et al. |
| 2019/0392905 A1 | 12/2019 | Hioka et al. |
| 2020/0111343 A1 | 4/2020 | Krejcarek |
| 2021/0048960 A1* | 2/2021 | Son ....................... G11C 5/025 |

\* cited by examiner

NOISE REDUCTION DURING PARALLEL PLANE ACCESS IN A MULTI-PLANE MEMORY DEVICE

RELATED APPLICATIONS

This application is a continuation of U.S. patent application Ser. No. 16/946,867, filed Jul. 9, 2020, the entire contents of which are hereby incorporated by reference herein.

TECHNICAL FIELD

Embodiments of the disclosure relate generally to memory sub-systems, and more specifically, relate to noise reduction during parallel plane access in a multi-plane memory device in a memory sub-system.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
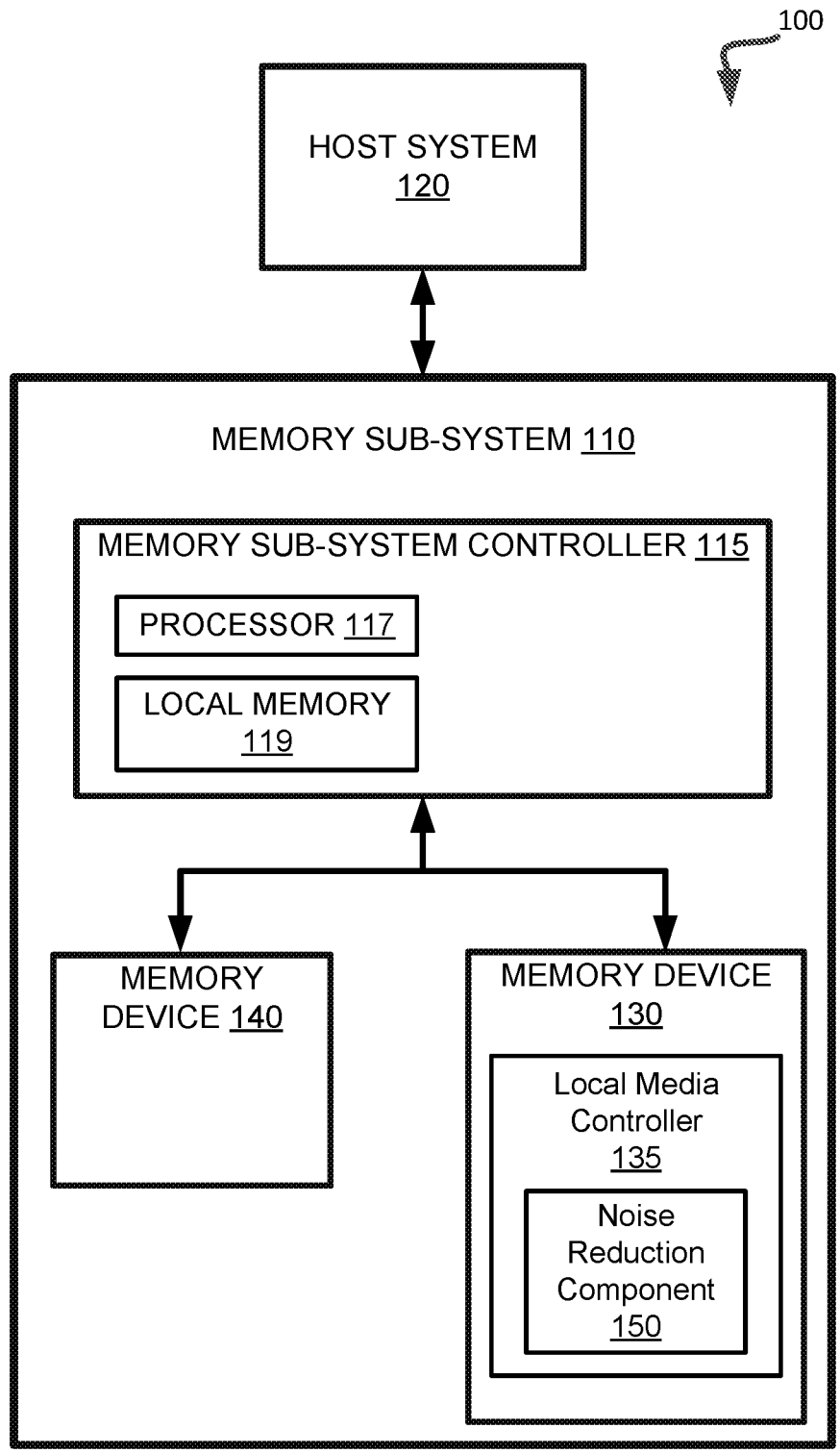
FIG. 1 illustrates an example computing system that includes a memory sub-system in accordance with some embodiments of the present disclosure.

Aspects of the present disclosure are directed to noise reduction during parallel plane access in a multi-plane memory device in a memory sub-system. A memory sub-system can be a storage device, a memory module, or a hybrid of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. One example of non-volatile memory devices is a negative-and (NAND) memory device. Other examples of non-volatile memory devices are described below in conjunction with FIG. 1. A non-volatile memory device is a package of one or more dies. Each die can consist of one or more planes. For some types of non-volatile memory devices (e.g., NAND devices), each plane consists of a set of physical blocks. Each block consists of a set of pages. Each page consists of a set of memory cells ("cells"). A cell is an electronic circuit that stores information. Depending on the cell type, a cell can store one or more bits of binary information, and has various logic states that correlate to the number of bits being stored. The logic states can be represented by binary values, such as "0" and "1", or combinations of such values.

A memory device can be made up of bits arranged in a two-dimensional or a three-dimensional grid. Memory cells are formed onto a silicon wafer in an array of columns (also hereinafter referred to as bitlines) and rows (also hereinafter referred to as wordlines). A wordline can refer to one or more rows of memory cells of a memory device that are used with one or more bitlines to generate the address of each of the memory cells. The intersection of a bitline and wordline constitutes the address of the memory cell. A block hereinafter refers to a unit of the memory device used to store data and can include a group of memory cells, a wordline group, a wordline, or individual memory cells. One or more blocks can be grouped together to form a plane of the memory device in order to allow concurrent operations to take place on each plane. The memory device can include circuitry that performs concurrent memory page accesses of two or more memory planes. For example, the memory device can include multiple access line driver circuits and power circuits that can be shared by the planes of the memory device to facilitate concurrent access of pages of two or more memory planes, including different page types. For ease of description, these circuits can be generally referred to as independent plane driver circuits.

In certain memory devices, each of the independent plane driver circuits can share a common ground supply line (e.g., 0V). Certain operations performed by one or more of the independent plane driver circuits can generate noise that impacts the voltage level on this ground supply line. For example, after a read operation, when the signal lines of a memory array of the memory device are discharged, the excess charge flows to the ground supply line which can cause the voltage level to be pulled higher than 0V, thus raising the local ground. This can impact the operation of transistors, such as nMOS transistors used for sensing, in the associated independent plane driver circuit, as well as any other independent plane driver circuits that share the common ground supply line. For example, if the voltage level of the ground supply line increases due to a discharge event on one plane of the memory device, the voltage level can become higher than a gate voltage of a nMOS sensing transistor in an independent plane driver circuit performing a read operation on another plane of the memory device, thereby causing the sensing transistor to turn off, and potentially resulting in sensing errors during a read operation. In addition, as the level of charge flowing to the ground supply line dissipates, the transistor can turn back on. This phenomenon is sometimes referred to as ground bounce, and is generally undesirable in the operation of the memory devices. As the number of independent plane driver circuits in the memory device increases, so too does the negative impact from this ground bounce as it is more likely that at least one of the independent plane driver circuits will be generating noise on the ground supply line that will negatively impact the sensitive nMOS sensing operations of another of the independent plane driver circuits.

Aspects of the present disclosure address the above and other deficiencies by managing quiet events and high noise events associated with memory access operations being performed concurrently on separate planes of a multi-plane memory device in order to reduce the levels of noise during certain time periods. As described herein, the multi-plane memory device can include multiple planes, each having an associated independent plane driver circuit configured to perform memory access operations concurrently (e.g., at least partially overlapping in time). During the course of these memory access operations, a certain independent plane driver circuit can encounter a quiet event (e.g., a period of time when less noise on a shared common supply line is desirable to avoid negative impact on sensitive operations being performed). When such a quiet event is encountered, a noise reduction component on the memory device can determine whether any other independent plane driver circuits are concurrently experiencing a high noise event (e.g., a period of time when noise is generated on the shared common supply line). If so, depending on respective priorities associated with the corresponding independent plane driver circuits, the noise reduction component can suspend one of the high noise event or the quiet event to prevent a conflict and avoid the negative impact that the noise on the shared common supply line can cause. In one embodiment, the noise reduction component assigns the respective priorities based on an order in which commands corresponding to the memory access operations were received at the memory device. For example, if a certain command directed to a first plane of the memory device is received before another command directed to a second plane, a first independent plane driver circuit associated with the first plane would have priority over a second independent plane driver circuit associated with the second plane. Thus, the noise reduction component will not interrupt a first memory access operation being performed by the first independent plane driver circuit, but will interrupt a second memory access operation being performed by the second independent plane driver circuit, if such was in conflict with the first memory access operation.

Advantages of this approach include, but are not limited to, a reduction in the amount of noise present on the shared common supply line when at least one of the independent plane driver circuits is experiencing a quiet event. The reduction in noise minimizes the negative impact (e.g., ground bounce) which can improve performance in the memory device. For example, an error rate associated with performing the memory access operations can be reduced without significantly impacting latency. Thus, the overall quality of service provided by the memory device is improved.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130,140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can be a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, memory sub-system 110 is a managed memory device, which includes a raw memory device 130 having control logic (e.g., local media controller 135) on the die and a controller (e.g., memory sub-system controller 115) for media management within the same memory device package. An example of a managed memory device is a managed NAND (MNAND) device.

In one embodiment, the memory device 130 includes noise reduction component 150. In one embodiment, local media controller 135 of memory device 130 includes at least a portion of noise reduction component 150. In such an embodiment, noise reduction component 150 can be implemented using hardware or as firmware, stored on memory device 130, executed by the control logic (e.g., local media controller 135) to perform the operations related to noise reduction during parallel plane access described herein. In some embodiments, the memory sub-system controller 115 includes at least a portion of plane selection circuit 150. For example, the memory sub-system controller 115 can include a processor 117 (e.g., a processing device) configured to execute instructions stored in local memory 119 for performing the operations described herein.

In one embodiment noise reduction component 150 can manage quiet events and high noise events associated with memory access operations being performed concurrently on separate planes of memory device 130 in order to reduce the levels of noise during certain time periods. Memory device 130 can be a multi-plane memory device including multiple planes, each having an associated independent plane driver circuit configured to perform memory access operations concurrently (e.g., at least partially overlapping in time). During performance of these memory access operations, a certain independent plane driver circuit can encounter a quiet event (e.g., a period of time when less noise on a shared common supply line is desirable to avoid negative impact on sensitive sensing operations being performed). When such a quiet event is encountered, noise reduction component 150 can determine whether any other independent plane driver circuits are concurrently experiencing a high noise event (e.g., a period of time when noise is generated on the shared common supply line). If so, depending on respective priorities associated with the corresponding independent plane driver circuits, the noise reduction component can suspend either the high noise event or the quiet event to prevent a conflict and avoid the negative impact that the noise on the shared common supply line can cause. In one embodiment, noise reduction component 150 assigns the respective priorities based on an order in which commands corresponding to the memory access operations were received at the memory device 130 or memory sub-system 110. In general, noise reduction component 150 will allow either quiet events or high noise events associated with an independent plane driver circuit having a higher priority to be performed uninterrupted. Conversely, noise reduction component 150 will suspend, pause, or otherwise delay conflicting quiet events or high noise events associated with an independent plane driver circuit having a lower priority until the occurrence of such events will no longer impact operations of the independent plane driver circuit having a higher priority. Further details with regards to the operations of noise reduction component 150 are described below.

Figure 2:
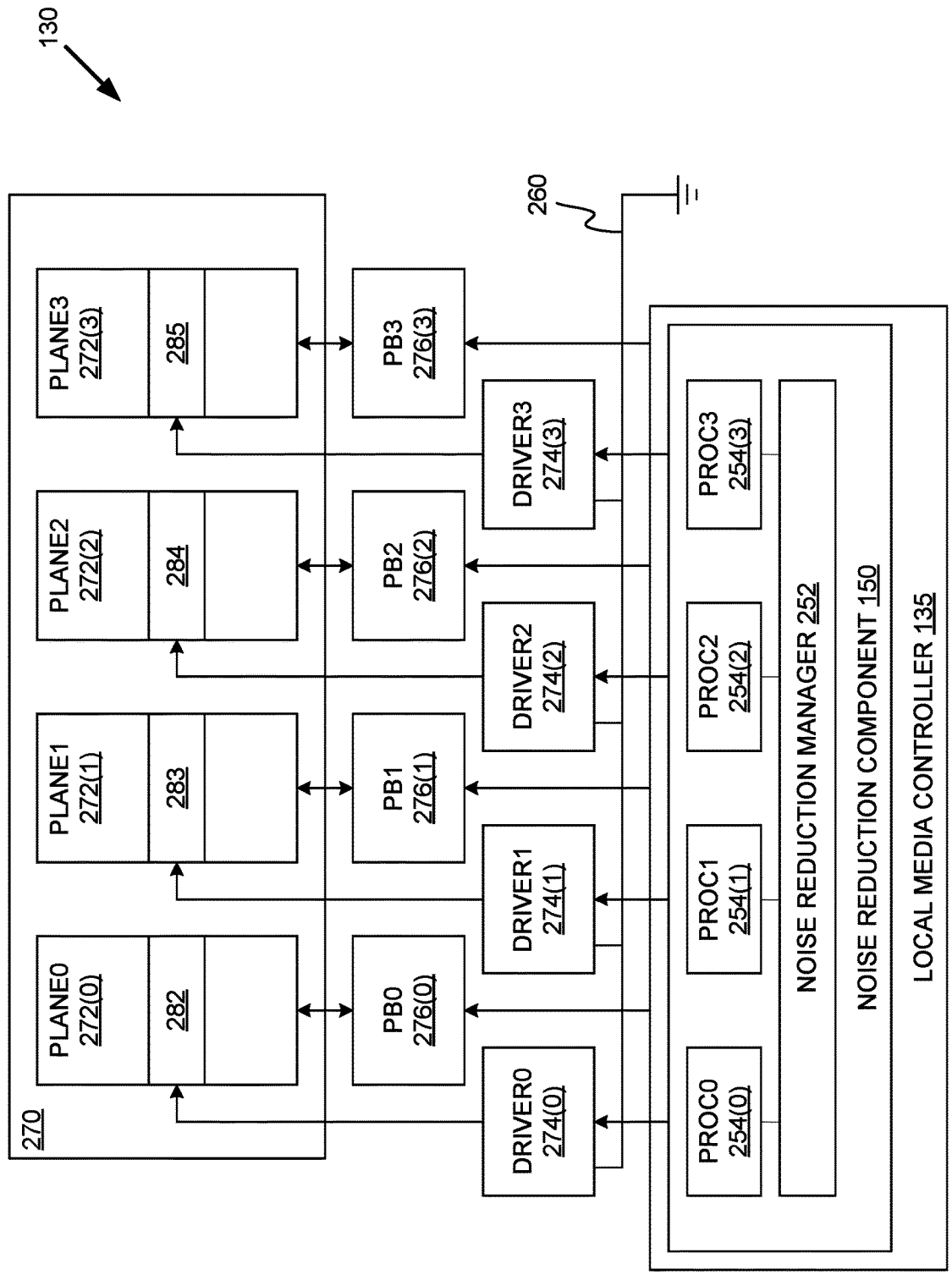
FIG. 2 is a block diagram illustrating a multi-plane memory device configured for noise reduction during parallel plane access in accordance with some embodiments of the present disclosure.

FIG. 2 is a block diagram illustrating a multi-plane memory device 130 configured for independent parallel plane access in accordance with some embodiments of the present disclosure. The memory planes 272(0)-272(3) can each be divided into blocks of data, with a different relative block of data from two or more of the memory planes 272(0)-272(3) concurrently accessible during memory access operations. For example, during memory access operations, two or more of data block 282 of the memory plane 272(0), data block 283 of the memory plane 272(1), data block 284 of the memory plane 272(2), and data block 285 of the memory plane 272(3) can each be accessed concurrently.

The memory device 130 includes a memory array 270 divided into memory planes 272(0)-272(3) that each includes a respective number of memory cells. The multi-plane memory device 130 can further include local media controller 135, including a power control circuit and access control circuit for concurrently performing memory access operations for different memory planes 272(0)-272(3). The memory cells can be non-volatile memory cells, such as NAND flash cells, or can generally be any type of memory cells.

The memory planes 272(0)-272(3) can each be divided into blocks of data, with a different relative block of data from each of the memory planes 272(0)-272(3) concurrently accessible during memory access operations. For example, during memory access operations, data block 282 of the memory plane 272(0), data block 283 of the memory plane 272(1), data block 284 of the memory plane 272(2), and data block 285 of the memory plane 272(3) can each be accessed concurrently.

Each of the memory planes 272(0)-272(3) can be coupled to a respective page buffer 276(0)-276(3). Each page buffer 276(0)-276(3) can be configured to provide data to or receive data from the respective memory plane 272(0)-272(3). The page buffers 276(0)-276(3) can be controlled by local media controller 135. Data received from the respective memory plane 272(0)-272(3) can be latched at the page buffers 276(0)-276(3), respectively, and retrieved by local media controller 135, and provided to the memory sub-system controller 115 via the NVMe interface.

Each of the memory planes 272(0)-272(3) can be further coupled to a respective access driver circuit 274(0)-274(3), such as an access line driver circuit. The driver circuits 274(0)-274(3) can be configured to condition a page of a respective block of an associated memory plane 272(0)-272(3) for a memory access operation, such as programming data (i.e., writing data), reading data, or erasing data. Each of the driver circuits 274(0)-274(3) can be coupled to a respective global access lines associated with a respective memory plane 272(0)-272(3). Each of the global access lines can be selectively coupled to respective local access lines within a block of a plane during a memory access operation associated with a page within the block. The driver circuits 274(0)-274(3) can be controlled based on signals from local media controller 135. Each of the driver circuits 274(0)-274(3) can include or be coupled to a respective power circuit, and can provide voltages to respective access lines based on voltages provided by the respective power circuit. The voltages provided by the power circuits can be based on signals received from local media controller 135.

The local media controller 135 can control the driver circuits 274(0)-274(3) and page buffers 276(0)-276(3) to concurrently perform memory access operations associated with each of a group of memory command and address pairs (e.g., received from memory sub-system controller 115). For example, local media controller 135 can control the driver circuits 274(0)-274(3) and page buffer 376(0)-376(3) to perform the concurrent memory access operations. Local media controller 135 can include a power control circuit that serially configures two or more of the driver circuits 274(0)-274(3) for the concurrent memory access operations, and an access control circuit configured to control two or more of the page buffers 276(0)-276(3) to sense and latch data from the respective memory planes 272(0)-272(3), or program data to the respective memory planes 272(0)-272(3) to perform the concurrent memory access operations.

In operation, local media controller 135 can receive a group of memory command and address pairs via the NVMe bus, with each pair arriving in parallel or serially. In some examples, the group of memory command and address pairs can each be associated with different respective memory planes 272(0)-272(3) of the memory array 270. The local media controller 135 can be configured to perform concurrent memory access operations (e.g., read operations or program operations) for the different memory planes 272(0)-272(3) of the memory array 270 responsive to the group of memory command and address pairs. For example, the power control circuit of local media controller 135 can serially configure, for the concurrent memory access operations based on respective page type (e.g., UP, MP, LP, XP, SLC/MLC/TLC/QLC page), the driver circuits 274(0)-274(3) for two or more memory planes 272(0)-272(3) associated with the group of memory command and address pairs. After the access line driver circuits 274(0)-274(3) have been configured, the access control circuit of local media controller 135 can concurrently control the page buffers 276(0)-276(3) to access the respective pages of each of the two or more memory planes 272(0)-272(3) associated with the group of memory command and address pairs, such as retrieving data or writing data, during the concurrent memory access operations. For example, the access control circuit can concurrently (e.g., in parallel and/or contemporaneously) control the page buffers 276(0)-276(3) to charge/discharge bitlines, sense data from the two or more memory planes 272(0)-272(3), and/or latch the data.

Based on the signals received from local media controller 135, the driver circuits 274(0)-274(3) that are coupled to the memory planes 272(0)-272(3) associated with the group of memory command and address command pairs can select blocks of memory or memory cells from the associated memory plane 272(0)-272(3), for memory operations, such as read, program, and/or erase operations. The driver circuits 274(0)-274(3) can drive different respective global access lines associated with a respective memory plane 272(0)-272(3). As an example, the driver circuit 274(0) can drive a first voltage on a first global access line associated with the memory plane 272(0), the driver circuit 274(1) can drive a second voltage on a third global access line associated with the memory plane 272(1), the driver circuit 274(2) can drive a third voltage on a seventh global access line associated with the memory plane 272(2), etc., and other voltages can be driven on each of the remaining global access lines. In some examples, pass voltages can be provided on all access lines except an access line associated with a page of a memory plane 272(0)-272(3) to be accessed. The local media controller 135, the driver circuits 274(0)-274(3) can allow different respective pages, and the page buffers 276(0)-276(3) within different respective blocks of memory cells, to be accessed concurrently. For example, a first page of a first block of a first memory plane can be accessed concurrently with a second page of a second block of a second memory plane, regardless of page type.

The page buffers 276(0)-276(3) can provide data to or receive data from the local media controller 135 during the memory access operations responsive to signals from the local media controller 135 and the respective memory planes 272(0)-272(3). The local media controller 135 can provide the received data to memory sub-system controller 115.

It will be appreciated that the memory device 130 can include more or less than four memory planes, driver circuits, and page buffers. It will also be appreciated that the respective global access lines can include 8, 16, 32, 64, 128, etc., global access lines. The local media controller 135 and the driver circuits 274(0)-274(3) can concurrently access different respective pages within different respective blocks of different memory planes when the different respective pages are of a different page type. In another embodiment, memory device 130 can include fewer driver circuits than there are planes. In such an embodiment, memory device 130 can further includes a plane selection circuit (e.g., a number of bi-directional multiplexer circuits) controlled by control signals received from local media controller 135. The plane selection circuit allows any of the driver circuits to be selectively coupled to any of the memory planes in memory device 130. In this manner, there is not a fixed association between any of the driver circuits and any of the planes.

In one embodiment, driver circuits 274(0)-274(3) share a common voltage supply line 260. Depending on the embodiment, common voltage supply line 260 can provide a positive voltage signal, a negative voltage signal, or a ground voltage signal to driver circuits 274(0)-274(3) to enable operation of certain components, such as nMOS transistors, within driver circuits 274(0)-274(3). While accessing different memory planes, the driver circuits 274(0)-274(3) can perform memory access operations that include quiet events and high noise events. Quiet events include periods of time when less noise on shared common supply line 260 is desirable to avoid negative impact on sensitive sensing operations being performed. For example, quiet events can include sensing operations, de-boosting operations, data latching operations, or other operations performed by the driver circuits 274(0)-274(3). High noise events include periods of time when noise is generated on shared common supply line 260. For example, high noise events can include bit line pre-charge operations, boosting operations, array discharge operations, or other operations performed by the driver circuits 274(0)-274(3). When a high noise event associated with one of the driver circuits 274(0)-274(3) occurs concurrently with a quiet event associated with another one of the driver circuits 274(0)-274(3), the noise can generate signal bounce in common voltage supply line 260 that can negatively impact a sensing operation, for example.

In one embodiment, memory device 130 includes noise reduction component 150 that can manage quiet events and high noise events associated with memory access operations being performed concurrently by driver circuits 274(0)-274(3) on planes 272(0)-272(3) in order to reduce the levels of noise on common voltage supply line 260. In one embodiment, noise reduction component 150 includes noise reduction manager 252 and processors 254(0)-254(3). In one embodiment, each of processors 254(0)-254(3) corresponds to one of driver circuits 274(0)-274(3) and is responsible for monitoring and controlling operations thereof. For example, each of processors 254(0)-254(3) can monitor the status of operations being performed by the corresponding one of driver circuits 274(0)-274(3) and report that status to noise reduction manager 252. In addition, each of processors 254(0)-254(3) can receive instructions from noise reduction manager 252, such as whether to permit, suspend, or resume quiet events or high noise events during the operations being performed by the corresponding one of driver circuits 274(0)-274(3). Noise reduction manager 252 can manage the status of driver circuits 274(0)-274(3), identify conflicts between quiet events and high noise events, determine respective priorities of driver circuits 274(0)-274(3), and resolve those conflicts by scheduling quiet events and high noise events associated with driver circuits 274(0)-274(3) based on the respective priorities.

Figure 3:
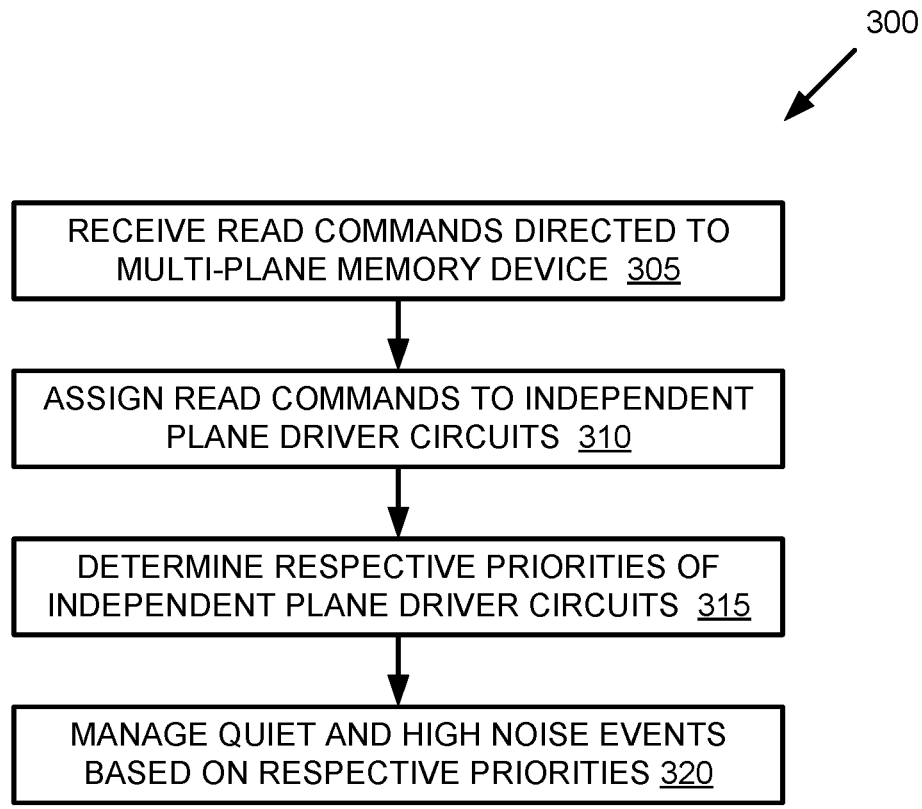
FIG. 3 is a flow diagram of an example method of noise reduction during parallel plane access in a multi-plane memory device in a memory sub-system in accordance with some embodiments of the present disclosure.

FIG. 3 is a flow diagram of an example method of noise reduction during parallel plane access in a multi-plane memory device in a memory sub-system in accordance with some embodiments of the present disclosure. The method 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 300 is performed by noise reduction component 150 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 305, memory access commands are received. For example, processing logic (e.g., local media controller 135) can receive a series of memory access command directed to a memory device, such as memory device 130. In one embodiment, the memory access commands are read commands, which can be received from a controller, such as memory sub-system controller 115, some other component of memory sub-system 110, or from an external component, such as host system 120. In one embodiment, the read commands specify at least one of a logical or physical address associated with data to be read from memory device 130.

At operation 310, a corresponding plane of a memory device is identified for each memory access command. For example, the processing logic can identify a corresponding one of a number of planes, such as memory planes 272(0)-272(3), of a memory array 270 of the memory device to which each read command is directed. In one embodiment, the processing logic identifies the plane of memory planes 272(0)-272(3) storing a block of data corresponding to the logical or physical address included in each received read command. For example, local media controller 135 can maintain a mapping of memory addresses to each of the memory planes 272(0)-272(3). Upon identifying the corresponding planes, the processing logic can assign the read commands in independent plane driver circuits 274(0)-274(3) associated with the memory planes 272(0)-272(3). In one embodiment, each driver circuit is associated with one of memory planes 272(0)-272(3). Accordingly, the processing logic can assign each read command to one of driver circuits 274(0)-274(3) associated with the one of memory planes 272(0)-272(3) to which the read command is directed. In one embodiment, the processing logic can assign the read command to one of driver circuits 274(0)-274(3), the processing logic can add an indication of the read command to a queue (e.g., a buffer, FIFO, etc.) of commands associated with the driver circuit and to be processed by an associated one of processors 254(0)-254(3). The associated one of processors 254(0)-254(3) can subsequently send read commands from the associated queue to the driver circuit which can perform the memory access operation on a block of the corresponding memory plane.

At operation 315, respective priorities of the independent plane driver circuits are determined. For example, the processing logic can assign and/or determine respective priorities to each of independent plane driver circuits 274(0)-274(3). These priorities can be used to manage quiet events and high noise events associated with the independent plane driver circuits 274(0)-274(3) to prevent conflicts and avoid the negative impact of noise on the shared common supply line 260. In one embodiment, noise reduction manager 252 assigns the respective priorities based on an order in which commands corresponding to the memory access operations were received at memory device 130. For example, if a certain command directed to a first plane 272(0) and assigned to driver circuit 274(0) is received before another command directed to a second plane 272(1) and assigned to driver circuit 274(1), noise reduction manage 252 can assign a higher priority to driver circuit 274(0) than driver circuit 274(1). In one embodiment, noise reduction manager 252 can maintain a ordered list or other data structure of each command indicating the order in which they were received and the one of driver circuits 274(0)-274(3) to which they are assuaged. Thus, to determine the respective priorities, noise reduction manager 252 can compare the position of any two or more read commands and/or driver circuits in the list to determine an order in which those read commands were received. In another embodiment, the respective priorities are based on a read type (e.g., SLC, MLC, TLC, QLC) or page type (e.g., lower page, upper page, extra page). For example, certain read types or page types can be given priority over other read types or page types. In one embodiment, noise reduction manager 252 can give any SLC read a higher priority so that the SLC read is not interrupted by a slower TLC or QLC read, for example.

At operation 320, events occurring during the performance of memory access operations are managed. For example, the processing logic can manage quiet events and high noise events corresponding to the read commands based on the respective priorities of the independent plane driver circuits 274(0)-274(3). In one embodiment, noise reduction manager 252 can prevent a high noise event associated with a first independent plane driver having a lower priority from interrupting a quiet event associated with a second independent plane driver having a higher priority. For example, noise reduction manager 252 can suspend the high noise event until the quiet event is complete, as described in more detail below. In another embodiment, noise reduction manager 252 can prevent a quiet event associated with the first independent plane driver circuit having the lower priority from interrupting a high noise event associated with the second independent plane driver circuit having the higher priority. For example, noise reduction manager 252 can suspend the quiet event until the high noise event is complete, as described in more detail below.

In another embodiment, the processing logic manages the quiet events and high noise events according to one or more configuration parameters. For example, the configuration parameters can control how many quiet events and high noise events can occur concurrently in memory device 130. In one embodiment, noise reduction manager 252 can determine whether a number of high noise events occurring concurrently with a quiet event associated with an independent plane driver circuit having a higher priority satisfies a threshold criterion. In one embodiment, noise reduction manager 252 compares the number of high noise events to a threshold number and determines that the number of high noise events satisfies the threshold criterion if the number of high noise events is greater than or equal to the threshold number. For example, if the threshold number is two, noise reduction component 150 can be configured to indicate that a higher priority quiet event can still tolerate one concurrent high noise event associated with another driver circuit, but cannot tolerate two concurrent high noise events associated with two other driver circuits. Thus, responsive to determining that the number of high noise events satisfying the threshold criterion (e.g., is greater than or equal to the threshold number), noise reduction manager 252 can suspend the high noise events and permit the quiet event to occur. Upon completion of the quiet event, noise reduction manager 252 can resume the performance of the high noise events. In one embodiment, the threshold number is a configurable configuration parameter which can be adjusted based on the particular implementation and use of memory device 130.

Figure 4:
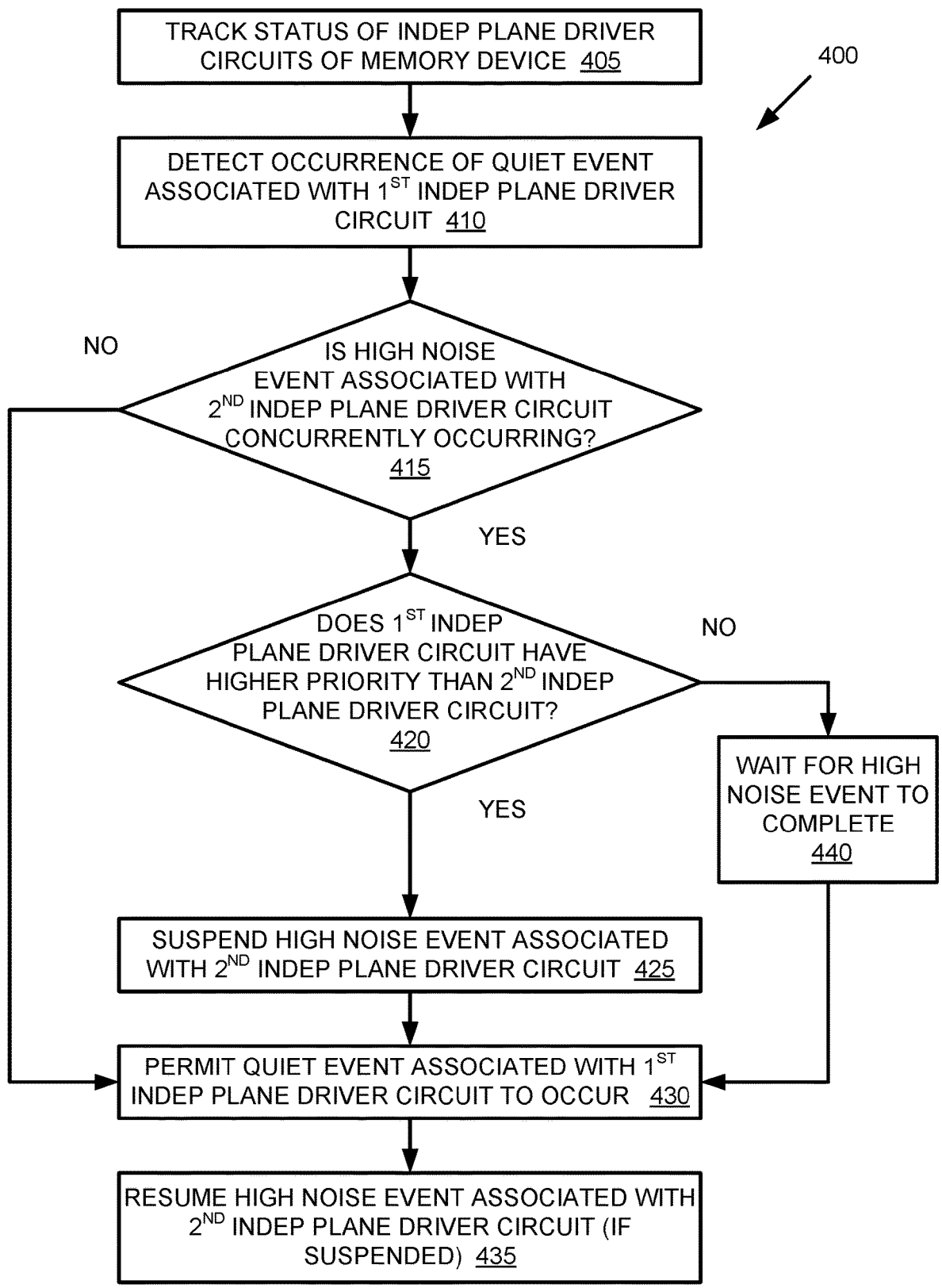
FIG. 4 is a flow diagram of an example method of noise reduction during parallel plane access in a multi-plane memory device in a memory sub-system in accordance with some embodiments of the present disclosure.

FIG. 4 is a flow diagram of an example method of noise reduction during parallel plane access in a multi-plane memory device in a memory sub-system in accordance with some embodiments of the present disclosure. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by noise reduction component 150 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 405, a status is tracked. For example, the processing logic can track the status of independent plane driver circuits 274(0)-274(3). In one embodiment, tracking the status can include monitoring the performance of memory access operations, such as read operations, being performed by independent plane driver circuits 274(0)-274(3) on memory planes 272(0)-272(3) of memory device 130. In one embodiment, noise reduction manager 252 maintains an indication of the status in some local memory to be referenced during the noise reduction operations, as described in more detail below.

At operation 410, the occurrence of an event is detected. For example, the processing logic can detect the occurrence of a quiet event associated with a first independent plane driver circuit, such as driver circuit 274(0), corresponding to a first plane, such as memory plane 272(0), of multiple memory planes 272(0)-272(3) of memory device 130. In one embodiment, the quiet event occurs during performance of a memory access operation by driver circuit 274(0) on memory plane 272(0) and includes a period of time when less noise on a shared common supply line 260 is desirable. For example, the quiet event can include a sensing operation performed by driver circuit 274(0) to read data from a block 282 of memory plane 272(0), which would be negatively impacted by noise on shared common supply line 260. In one embodiment, noise reduction manager 252 can detect the occurrence of a quiet event based on feedback received from a processor 254(0) associated with driver circuit 274(0).

At operation 415, a determination of whether a concurrent event is occurring is made. For example, the processing logic can determine whether a high noise event associated with a second independent plane driver circuit, such as driver circuit 274(1), corresponding to a second plane, such as memory plane 272(1), of multiple memory planes 272(0)-272(3) of memory device 130 is concurrently occurring (e.g., at least partially overlapping in time). In one embodiment, the high noise event occurs during performance of the memory access operation by driver circuit 274(1) on memory plane 272(1) and includes a period of time when a certain level of noise is generated on the shared common supply line 260. For example, the high noise event can include an operation performed by driver circuit 274(1) that generates signal bounce on shared common supply line 260. In one embodiment, noise reduction manager 252 can detect the occurrence of a high noise event based on feedback received from a processor 254(1) associated with driver circuit 274(1) and can determine that it is a concurrent event if it occurs while a quiet event is still being performed (e.g., if the high noise event is detected before an indication that the quiet event has been completed is received). If no high noise event is occurring concurrently, processing proceeds to operation 430, where the quiet event is permitted to occur.

If, however, a high noise event is occurring concurrently, processing proceeds to operation 420. At operation 420, respective priorities are compared. For example, the processing logic can determine whether the first independent plane driver circuit 274(0) has a higher priority that the second independent plane driver circuit 274(1). In one embodiment, noise reduction manager 252 assigns the respective priorities based on an order in which commands corresponding to the memory access operations were received at memory device 130. For example, if a certain command directed to a first plane 272(0) and assigned to driver circuit 274(0) is received before another command directed to a second plane 272(1) and assigned to driver circuit 274(1), noise reduction manage 252 can assign a higher priority to driver circuit 274(0) than driver circuit 274(1). In one embodiment, noise reduction manager 252 can maintain a ordered list or other data structure of each command indicating the order in which they were received and the one of driver circuits 274(0)-274(3) to which they are assuaged. Thus, to determine the respective priorities, noise reduction manager 252 can compare the position of any two or more read commands and/or driver circuits in the list to determine whether a first read operation being performed by the first independent plane driver circuit 274(0) and associated with the quiet event was received at the memory device 130 before a second read operation associated being performed by the second independent plane driver circuit 274(1) and associated with the high noise event. In another embodiment, the respective priorities are based on a read type.

If the first driver circuit 274(0) has higher priority than the second driver circuit 274(1), processing proceeds to operation 425. At operation 425, the high noise event is suspended. For example, the processing logic can suspend the high noise event associated with the second driver circuit 274(1). In one embodiment, noise reduction manager 252 sends a signal to processor 254(1) to cause processor 254(1) to stop a clock associated with driver circuit 274(1) so that the memory access operation being performed will stop. Any noise generated by that memory access operation will dissipate from shared common supply line 260. In one embodiment, processor 254(1) preserves the state of the memory access operation so that it can be resumed from the point at which it was suspended at a later time.

At operation 430, the quiet event is performed. For example, the processing logic can permit the quiet event associated with the first driver circuit 274(0) to be performed. In one embodiment, noise reduction manager 252 sends a signal to processor 254(0) to cause processor 254(0) to permit the memory access operation to be performed (i.e., to not stop the clock associated with driver circuit 274(0)). Since the high noise event was suspended at operation 425, there should not be any problematic noise in shared common supply line 260 that would impact the quiet event.

In one embodiment, if it is determined at operation 420 that the first driver circuit 274(0) does not have higher priority (i.e., has a lower priority) than the second driver circuit 274(1), processing proceeds to operation 440. At operation 440, the processing logic waits for the high noise event associated with the second driver circuit 274(1) to complete before the quiet event is performed at operation 430. In one embodiment, noise reduction component 150 suspends or delays the start of the quiet event associated with the first driver circuit 274(1) since the higher priority high noise event is introducing noise on shared common supply line 260. Since the high noise event is associated with the second driver circuit 274(1) having a higher priority, the high noise event is not interrupted. Thus, the quiet event can be permitted to occur at operation 430 once the high noise event is completed and the associated noise is no longer present on shared common supply line 260.

At operation 435, a suspended event is resumed. For example, if the high noise event associated with driver circuit 274(1) was suspended at operation 425, the processing logic can resume the high noise event in response to determining that the quiet event associated with driver circuit 274(0) has completed. In one embodiment, noise reduction manager 252 can receive a notification from processor 254(0) when the quiet event associated with driver circuit 274(0) is complete and can subsequently send a signal to processor 254(1) to cause processor 254(1) to resume the suspended high noise event (e.g., to restart the clock for driver circuit 274(1)).

Figure 5:
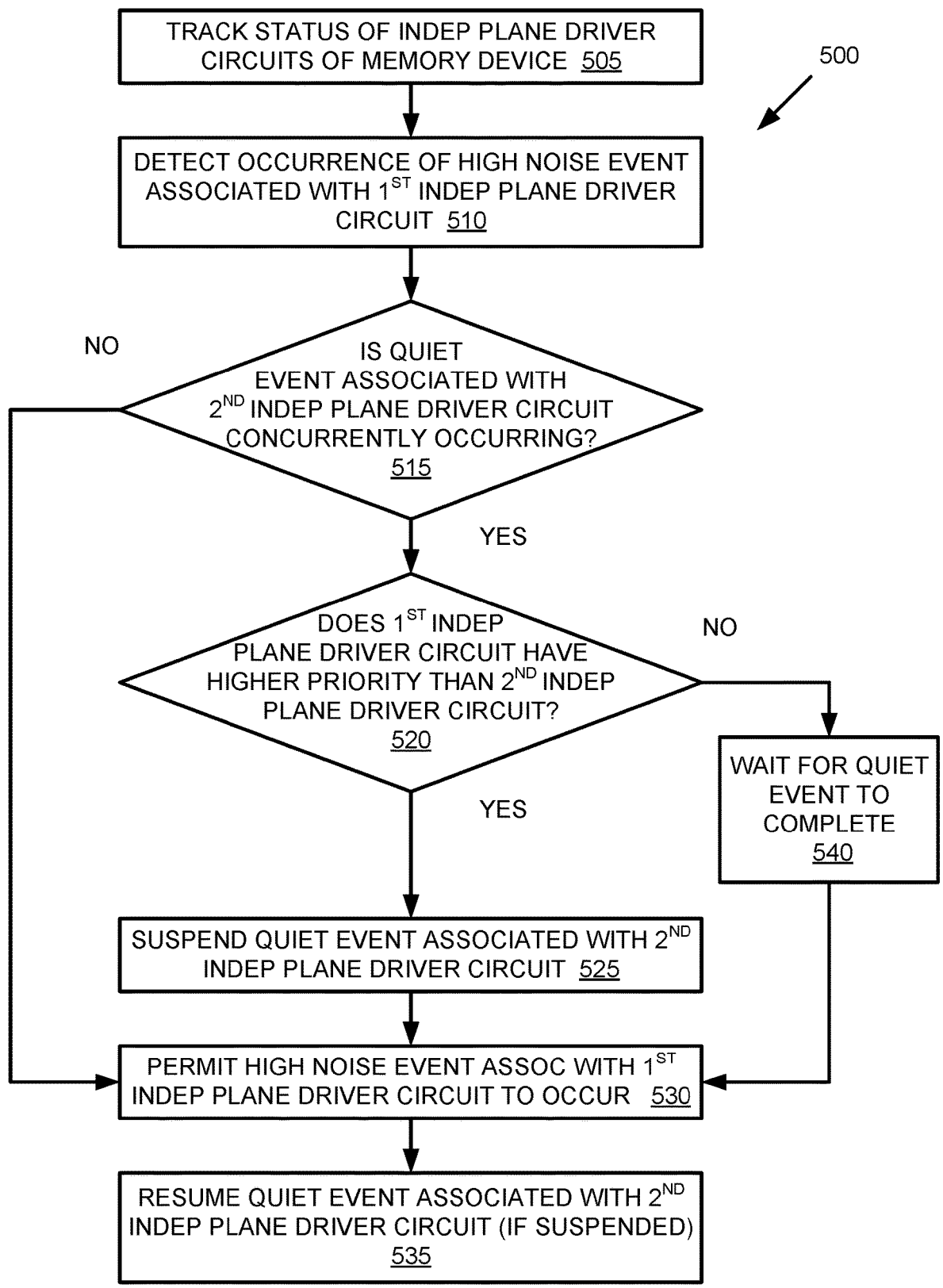
FIG. 5 is a flow diagram of an example method of noise reduction during parallel plane access in a multi-plane memory device in a memory sub-system in accordance with some embodiments of the present disclosure.

FIG. 5 is a flow diagram of an example method of noise reduction during parallel plane access in a multi-plane memory device in a memory sub-system in accordance with some embodiments of the present disclosure. The method 500 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 500 is performed by noise reduction component 150 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 505, a status is tracked. For example, the processing logic can track the status of independent plane driver circuits 274(0)-274(3). In one embodiment, tracking the status can include monitoring the performance of memory access operations, such as read operations, being performed by independent plane driver circuits 274(0)-274(3) on memory planes 272(0)-272(3) of memory device 130. In one embodiment, noise reduction manager 252 maintains an indication of the status in some local memory to be referenced during the noise reduction operations, as described in more detail below.

At operation 510, the occurrence of an event is detected. For example, the processing logic can detect the occurrence of a high noise event associated with a first independent plane driver circuit, such as driver circuit 274(0), corresponding to a first plane, such as memory plane 272(0), of multiple memory planes 272(0)-272(3) of memory device 130. In one embodiment, the high noise event occurs during performance of a memory access operation by driver circuit 274(0) on memory plane 272(0) and includes a period of time when a certain level of noise is generated on the shared common supply line 260. For example, the high noise event can include an operation performed by driver circuit 274(1) that generates signal bounce on shared common supply line 260. In one embodiment, noise reduction manager 252 can detect the occurrence of a high noise event based on feedback received from a processor 254(0) associated with driver circuit 274(0).

At operation 515, a determination of whether a concurrent event is occurring is made. For example, the processing logic can determine whether a quiet event associated with a second independent plane driver circuit, such as driver circuit 274(1), corresponding to a second plane, such as memory plane 272(1), of multiple memory planes 272(0)-272(3) of memory device 130 is concurrently occurring (e.g., at least partially overlapping in time). In one embodiment, the quiet event occurs during performance of the memory access operation by driver circuit 274(1) on memory plane 272(1) and includes a period of time when less noise on a shared common supply line 260 is desirable. For example, the quiet event can include a sensing operation performed by driver circuit 274(0) to read data from a block 282 of memory plane 272(0), which would negatively impacted by noise on shared common supply line 260. In one embodiment, noise reduction manager 252 can detect the occurrence of a quiet event based on feedback received from a processor 254(1) associated with driver circuit 274(1) and can determine that it is a concurrent event if it occurs while a high noise event is still being performed (e.g., if the quiet event is detected before an indication that the high noise event has been completed is received). If no quiet event is occurring concurrently, processing proceeds to operation 530, where the high noise event is permitted to occur.

If, however, a quiet event is occurring concurrently, processing proceeds to operation 520. At operation 520, respective priorities are compared. For example, the processing logic can determine whether the first independent plane driver circuit 274(0) has a higher priority that the second independent plane driver circuit 274(1). In one embodiment, noise reduction manager 252 assigns the respective priorities based on an order in which commands corresponding to the memory access operations were received at memory device 130. For example, if a certain command directed to a first plane 272(0) and assigned to driver circuit 274(0) is received before another command directed to a second plane 272(1) and assigned to driver circuit 274(1), noise reduction manage 252 can assign a higher priority to driver circuit 274(0) than driver circuit 274(1). In one embodiment, noise reduction manager 252 can maintain a ordered list or other data structure of each command indicating the order in which they were received and the one of driver circuits 274(0)-274(3) to which they are assuaged. Thus, to determine the respective priorities, noise reduction manager 252 can compare the position of any two or more read commands and/or driver circuits in the list to determine whether a first read operation being performed by the first independent plane driver circuit 274(0) and associated with the high noise event was received at the memory device 130 before a second read operation associated being performed by the second independent plane driver circuit 274(1) and associated with the quiet event. In another embodiment, the respective priorities are based on a read type.

If the first driver circuit 274(0) has higher priority than the second driver circuit 274(1), processing proceeds to operation 525. At operation 525, the quiet event is suspended. For example, the processing logic can suspend the quiet event associated with the second driver circuit 274(1). In one embodiment, noise reduction manager 252 sends a signal to processor 254(1) to cause processor 254(1) to stop a clock associated with driver circuit 274(1) so that the memory access operation being performed will stop. In one embodiment, processor 254(1) preserves the state of the memory access operation so that it can be resumed from the point at which it was suspended at a later time.

At operation 530, the high noise event is performed. For example, the processing logic can permit the high noise event associated with the first driver circuit 274(0) to be performed. In one embodiment, noise reduction manager 252 sends a signal to processor 254(0) to cause processor 254(0) to permit the memory access operation to be performed (i.e., to not stop the clock associated with driver circuit 274(0)). Since the quiet event was suspended at operation 525, the generated noise in shared common supply line 260 will not impact the quiet event.

In one embodiment, if it is determined at operation 520 that the first driver circuit 274(0) does not have higher priority than the second driver circuit 274(1), processing proceeds to operation 540. At operation 440, the processing logic waits for the quiet event associated with the second driver circuit 274(1) to complete before the high noise event is performed at operation 530. In one embodiment, noise reduction component 150 suspends or delays the start of the high noise event associated with the first driver circuit 274(1) since the higher priority quiet event would be negatively impacted by the noise on shared common supply line 260. Since the quiet event is associated with the second driver circuit 274(1) having a higher priority, the quiet event is not interrupted. Thus, the high noise event can be permitted to occur at operation 530 once the quiet event is completed.

At operation 535, a suspended event is resumed. For example, if the quiet event associated with driver circuit 274(1) was suspended at operation 525, the processing logic can resume the quiet event in response to determining that the high noise event associated with driver circuit 274(0) has completed. In one embodiment, noise reduction manager 252 can receive a notification from processor 254(0) when the high noise event associated with driver circuit 274(0) is complete and can subsequently send a signal to processor 254(1) to cause processor 254(1) to resume the suspended quiet event (e.g., to restart the clock for driver circuit 274(1)).

Figure 6:
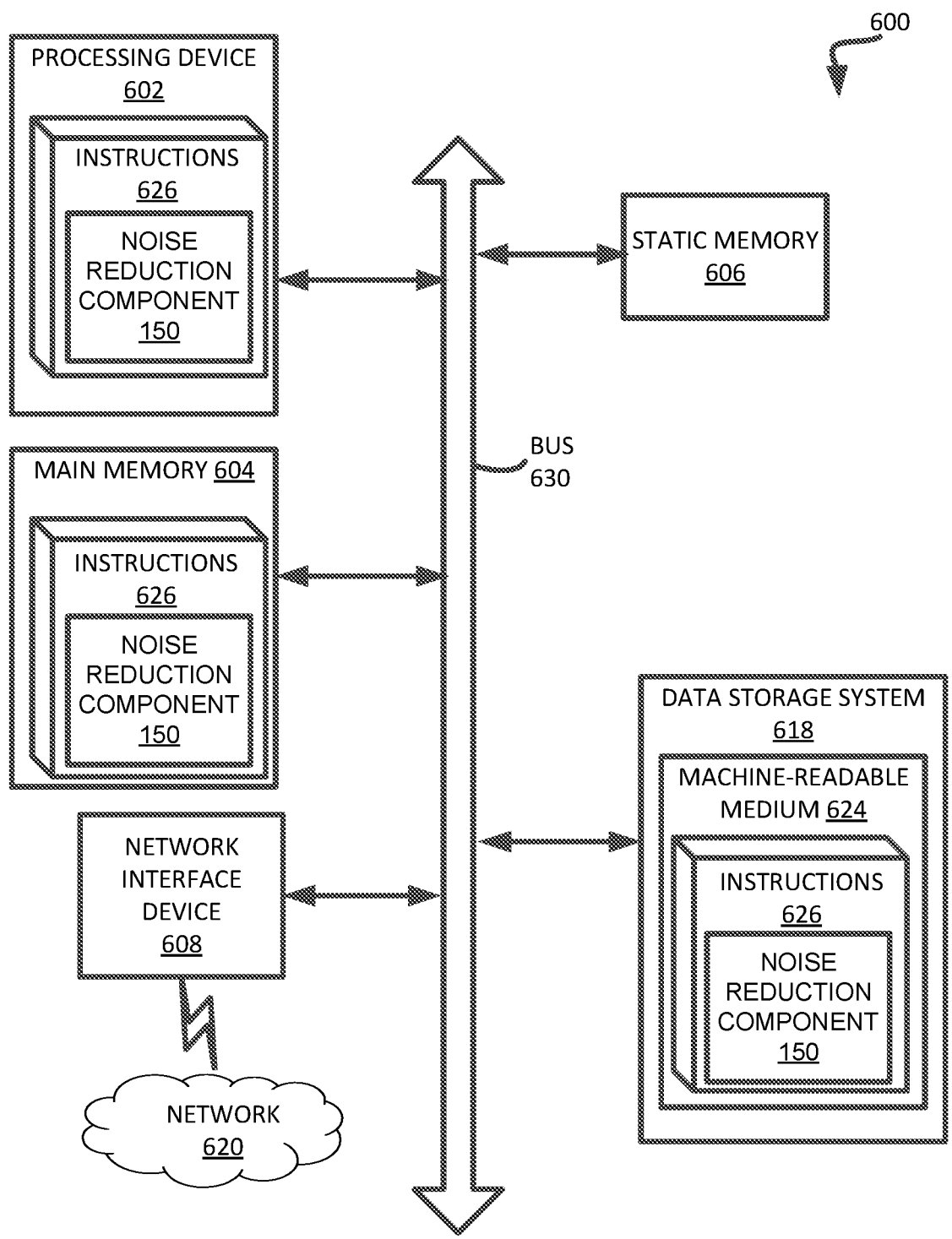
FIG. 6 is a block diagram of an example computer system in which embodiments of the present disclosure can operate.

FIG. 6 illustrates an example machine of a computer system 600 within which a set of instructions, for causing the machine to perform any one or more of the methodologies discussed herein, can be executed. In some embodiments, the computer system 600 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to noise reduction component 150 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or Rambus DRAM (RDRAM), etc.), a static memory 606 (e.g., flash memory, static random access memory (SRAM), etc.), and a data storage system 618, which communicate with each other via a bus 630.

Processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 can also be one or more special-purpose processing devices such as an application specific integrated circuit (ASIC), a field programmable gate array (FPGA), a digital signal processor (DSP), network processor, or the like. The processing device 602 is configured to execute instructions 626 for performing the operations and steps discussed herein. The computer system 600 can further include a network interface device 608 to communicate over the network 620.

The data storage system 618 can include a machine-readable storage medium 624 (also known as a computer-readable medium, such as a non-transitory computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to the memory sub-system 110 of FIG. 1.

In one embodiment, the instructions 626 include instructions to implement functionality corresponding to noise reduction component 150 of FIG. 1). While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A memory device comprising:
    a memory array comprising a plurality of planes;
    a plurality of independent plane driver circuits operatively coupled with the plurality of planes; and
    control logic, operatively coupled with the plurality of independent plane driver circuits, to perform operations comprising:
        detecting an occurrence of a high noise event associated with a first independent plane driver circuit of the plurality of independent plane driver circuits, the first independent plane driver circuit corresponding to a first plane of the plurality of planes;
        determining whether a quiet event associated with a second independent plane driver circuit of the plurality of independent plane driver circuits is concurrently occurring, the second independent plane driver circuit corresponding to a second plane of the plurality of planes; and
        responsive to determining that the quiet event associated with the second independent plane driver circuit is concurrently occurring, managing execution of the high noise event and the quiet event based on respective priorities of the first and second independent plane driver circuits.

2. The memory device of claim 1, wherein the control logic is to perform further operations comprising:
    tracking a plurality of read operations associated with the plurality of independent plane driver circuits, the plurality of read operations comprising quiet events and high noise events associated with reading data from the plurality of planes of the memory array.

3. The memory device of claim 1, wherein the quiet event comprises a sensing operation performed by the second independent plane driver circuit to read data from a block of the second plane.

4. The memory device of claim 1, wherein the high noise event comprises an operation performed by the first independent plane driver circuit that generates signal bounce in a common voltage supply shared by the plurality of independent plane driver circuits.

5. The memory device of claim 1, wherein managing execution of the high noise event and the quiet event based on respective priorities of the first and second independent plane driver circuits comprises determining whether the first independent plane driver circuit has a higher priority than the second independent plane driver circuit and determining whether a first read operation being performed by the first independent plane driver circuit and associated with the high noise event was received at the memory device before a second read operation associated being performed by the second independent plane driver circuit and associated with the quiet event.

6. The memory device of claim 1, wherein the control logic is to perform further operations comprising:
    responsive to determining that the first independent plane driver circuit has a lower priority than the second independent plane driver circuit, waiting for the quiet event associated with the second independent plane driver circuit to complete and subsequently permitting the high noise event associated with the first independent plane driver circuit to occur.

7. The memory device of claim 1, wherein the control logic is to perform further operations comprising:
    determining that the high noise event associated with the first independent plane driver circuit has completed and resuming the quiet event associated with the second independent plane driver circuit.

8. A method comprising:
receiving a plurality of commands directed to a memory device comprising a plurality of planes;
assigning the plurality of commands to a plurality of independent plane driver circuits associated with the plurality of planes; and
managing events corresponding to the plurality of commands based on respective priorities of the plurality of independent plane driver circuits, wherein managing the events comprises
determining whether a number of high noise events occurring concurrently with a quiet event associated with an independent plane driver circuit having a higher priority satisfies a threshold criterion; and
responsive to the number of high noise events satisfying the threshold criterion, suspending the high noise events and permitting the quiet event to occur.

9. The method of claim 8, wherein the respective priorities of the plurality of independent plane driver circuits are based on an order in which the plurality of commands corresponding to the plurality of independent plane driver circuits were received.

10. The method of claim 8, wherein managing the events further comprise:
preventing a quiet event associated with an independent plane driver circuit having a lower priority from interrupting a high noise event associated with the independent plane driver circuit having the higher priority.

11. A non-transitory computer-readable storage medium comprising instructions that, when executed by processing logic, cause the processing logic to perform operations comprising:
detecting an occurrence of a high noise event associated with a first independent plane driver circuit of a plurality of independent plane driver circuits associated with a plurality of planes of a memory device, the first independent plane driver circuit corresponding to a first plane of the plurality of planes;
determining whether a quiet event associated with a second independent plane driver circuit of the plurality of independent plane driver circuits is concurrently occurring, the second independent plane driver circuit corresponding to a second plane of the plurality of planes; and
responsive to determining that the quiet event associated with the second independent plane driver circuit is concurrently occurring, managing execution of the high noise event and the quiet event based on respective priorities of the first and second independent plane driver circuits.

12. The non-transitory computer-readable storage medium of claim 11, wherein the instructions cause the processing logic to perform further operations comprising:
tracking a plurality of read operations associated with the plurality of independent plane driver circuits, the plurality of read operations comprising quiet events and high noise events associated with reading data from the plurality of planes of the memory device.

13. The non-transitory computer-readable storage medium of claim 11, wherein the quiet event comprises a sensing operation performed by the second independent plane driver circuit to read data from a block of the second plane.

14. The non-transitory computer-readable storage medium of claim 11, wherein the high noise event comprises an operation performed by the first independent plane driver circuit that generates signal bounce in a common voltage supply shared by the plurality of independent plane driver circuits.

15. The non-transitory computer-readable storage medium of claim 11, wherein managing execution of the high noise event and the quiet event based on respective priorities of the first and second independent plane driver circuits comprises determining whether the first independent plane driver circuit has a higher priority than the second independent plane driver circuit and determining whether a first read operation being performed by the first independent plane driver circuit and associated with the high noise event was received at the memory device before a second read operation associated being performed by the second independent plane driver circuit and associated with the quiet event.

16. The non-transitory computer-readable storage medium of claim 11, wherein the instructions cause the processing logic to perform further operations comprising:
responsive to determining that the first independent plane driver circuit has a lower priority than the second independent plane driver circuit, waiting for the quiet event associated with the second independent plane driver circuit to complete and subsequently permitting the high noise event associated with the first independent plane driver circuit to occur.

17. The non-transitory computer-readable storage medium of claim 11, wherein the instructions cause the processing logic to perform further operations comprising:
determining that the high noise event associated with the first independent plane driver circuit has completed and resuming the quiet event associated with the second independent plane driver circuit.

* * * * *